United States Patent
Ma et al.

(10) Patent No.: US 11,922,846 B2
(45) Date of Patent: Mar. 5, 2024

(54) GATE DRIVING CIRCUIT AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Rui Ma, Beijing (CN); Xiaoye Ma, Beijing (CN); Xianjie Shao, Beijing (CN); Ruifang Du, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 17/755,900

(22) PCT Filed: Feb. 3, 2021

(86) PCT No.: PCT/CN2021/075127
§ 371 (c)(1),
(2) Date: May 11, 2022

(87) PCT Pub. No.: WO2021/169761
PCT Pub. Date: Sep. 2, 2021

(65) Prior Publication Data
US 2022/0383804 A1    Dec. 1, 2022

(30) Foreign Application Priority Data
Feb. 28, 2020   (CN) .......................... 202010129236.0

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01)

(58) Field of Classification Search
CPC ... G09G 3/20; G09G 2310/0286; G11C 19/28
See application file for complete search history.

(56) References Cited

U.S. PATENT DOCUMENTS 9,905,192 B2 * 2/2018 Wu ........................ G11C 19/28
2010/0156869 A1   6/2010 Lee et al.
(Continued)

FOREIGN PATENT DOCUMENTS

CN    105448258 A    3/2016
CN    105869566 A    8/2016
(Continued)

OTHER PUBLICATIONS

European Extended Search Report, dated Nov. 8, 2022, from European Patent App. No. 21760337.2.
(Continued)

*Primary Examiner* — Gene W Lee
(74) *Attorney, Agent, or Firm* — Workman Nydegger (57) ABSTRACT

Disclosed are a gate driving circuit and a display device. According to the gate driving circuit, in every five adjacent shift registers, the output control end of the first shift register is electrically connected to the input signal end of the fifth shift register; in every six adjacent shift registers, the output control end of the sixth shift register is electrically connected to the reset signal end of the first shift register. In the gate driving circuit of a cascade structure provided by the present disclosure, there are fewer cascade signal lines, thereby saving space, further implementing the narrow bezel of a display device; in addition, for the gate driving circuit of a cascade structure provided by the present disclosure, the signal provided by an external circuit board can be more (Continued)

flexible, even if a display product is manufactured, the pulse width of a clock signal can be adjusted by means of the external circuit board, thereby adjusting the high-level width of a gate signal output by a gate signal output end, and the flexibility is high.

20 Claims, 5 Drawing Sheets

(56) References Cited

U.S. PATENT DOCUMENTS

| | | |
|---|---|---|
| 2011/0274236 A1 | 11/2011 | Tobita |
| 2019/0251891 A1 | 8/2019 | Tang et al. |
| 2020/0020264 A1 | 1/2020 | Chen et al. |
| 2020/0219576 A1 | 7/2020 | Yao et al. |
| 2021/0335209 A1 | 10/2021 | Zou et al. |

FOREIGN PATENT DOCUMENTS

| | | |
|---|---|---|
| CN | 107610736 A | 1/2018 |
| CN | 108320692 A | 7/2018 |
| CN | 109584942 A | 4/2019 |
| CN | 109785787 A | 5/2019 |
| CN | 110010054 A | 7/2019 |
| CN | 110322848 A | 10/2019 |
| CN | 110364110 A | 10/2019 |
| CN | 111210758 A | 5/2020 |
| EP | 4044164 A1 | 8/2022 |

OTHER PUBLICATIONS

Chinese Office Action, dated Dec. 17, 2021, from Chinese Application No. 202010129236.0.
Chinese Decision of Rejection, dated May 26, 2022, from Chinese Application No. 202010129236.0.

* cited by examiner

GATE DRIVING CIRCUIT AND DISPLAY DEVICE

CROSS REFERENCE TO RELATED APPLICATIONS

The disclosure is a national phase entry under 35 U.S.C. § 371 of International Application No. PCT/CN2021/075127, filed on Feb. 3, 2021, which claims priority to Chinese Patent Application No. 202010129236.0, entitled "GATE DRIVING CIRCUIT AND DISPLAY DEVICE", filed to China National Intellectual Property Administration on Feb. 28, 2020, the entire contents of which are incorporated herein by reference.

FIELD

The disclosure relates to the technical field of display, in particular to a gate driving circuit and a display device.

BACKGROUND

With the rapid development of display technology, a display shows a development trend of high integration and low cost. A GOA (gate driver on array) technology integrates a TFT (thin film transistor) gate switching circuit on an array substrate of a display panel to achieve scanning drive of the display panel, so as to eliminate wiring spaces of a bonding region and a fan-out region of a gate integrated circuit (IC). The product cost can be reduced in terms of the material cost and a manufacturing process, and a beautiful design of symmetrical and narrow bezels on two sides can be realized on the display panel; moreover, the integration process can further eliminate the bonding process in a direction of a gate scanning line, so as to improve productivity and yield.

SUMMARY

An embodiment of the disclosure provides a gate driving circuit, including a plurality of cascaded shift registers, wherein each shift register includes an input signal terminal, a reset signal terminal, an output control terminal and a gate signal output terminal; the gate signal output terminals are electrically connected to gate lines of a display panel in a one-to-one corresponding mode; in every five adjacent shift registers, an output control terminal of a first shift register among the every five adjacent shift registers is electrically connected to an input signal terminal of a fifth shift register among the every five adjacent shift registers; and in every six adjacent shift registers, an output control terminal of a sixth shift register among the every six adjacent shift registers is electrically connected to the reset signal terminal of the first shift register among the every six adjacent shift registers.

In one possible implementation, the gate driving circuit provided by the embodiment of the disclosure, includes 10 clock signal lines, wherein each shift register further includes a clock signal terminal; the clock signal terminal of the (10k−9)th shift register is electrically connected to the first clock signal line, the clock signal terminal of the (10k−8)th shift register is electrically connected to the second clock signal line, the clock signal terminal of the (10k−7)th shift register is electrically connected to the third clock signal line, the clock signal terminal of the (10k−6)th shift register is electrically connected to the fourth clock signal line, the clock signal terminal of the (10k−5)th shift register is electrically connected to the fifth clock signal line, the clock signal terminal of the (10k−4)th shift register is electrically connected to the sixth clock signal line, the clock signal terminal of the (10k−3)th shift register is electrically connected to the seventh clock signal line, the clock signal terminal of the (10k−2)th shift register is electrically connected to the eighth clock signal line, the clock signal terminal of the (10k−1)th shift register is electrically connected to the ninth clock signal line, and the clock signal terminal of the (10k)th shift register is electrically connected to the tenth clock signal line; and k is a positive integer.

In one possible implementation, in the gate driving circuit provided by the embodiment of the disclosure, a clock signal duty cycle of each clock signal line is approximately 40%.

In one possible implementation, in the gate driving circuit provided by the embodiment of the disclosure, each shift register includes: an input circuit, a reset circuit, a control circuit, a first output circuit, a second output circuit and a frame start circuit. The input circuit is configured to control a potential of a first node in response to a signal input by the input signal terminal; the reset circuit is configured to provide a signal input by a first reference signal terminal to the first node in response to a signal input by the reset signal terminal; the control circuit is configured to provide the signal of the first reference signal terminal to a second node in response to the signal input by the input signal terminal, control the potentials of the first node and the second node in response to a signal input by a control signal terminal, provide a signal of a second reference signal terminal to the gate signal output terminal in response to a potential of the second node, and provide the signal of the first reference signal terminal to the output control terminal in response to the potential of the second node; the first output circuit is configured to provide a signal of the clock signal terminal to the gate signal output terminal in response to the potential of the first node; the second output circuit is configured to provide the signal of the clock signal terminal to the output control terminal in response to the potential of the first node; and the frame start circuit is configured to provide the signal of the first reference signal terminal to the first node in response to a signal input by a frame start signal terminal.

In one possible implementation, in the gate driving circuit provided by the embodiment of the disclosure, the input circuit includes a first switching transistor; and a gate and a first electrode of the first switching transistor are electrically connected to the input signal terminal, and a second electrode of the first switching transistor is electrically connected to the first node.

In one possible implementation, in the gate driving circuit provided by the embodiment of the disclosure, the reset circuit includes: a rest circuit switching transistor; and a gate of the rest circuit switching transistor is electrically connected to the reset signal terminal, a first electrode of the rest circuit switching transistor is electrically connected to the first node, and a second electrode of the rest circuit switching transistor is electrically connected to the first reference signal terminal.

In one possible implementation, in the gate driving circuit provided by the embodiment of the disclosure, the control circuit includes: a first control circuit switching transistor, a second control circuit switching transistor, a third control circuit switching transistor, a fourth control circuit switching transistor, a fifth control circuit switching transistor, a sixth control circuit switching transistor, a seventh control circuit switching transistor and an eighth control circuit switching transistor. A gate of the first control circuit switching transistor is electrically connected to the input signal terminal, a first electrode of the first control circuit switching transistor is electrically connected to the second node, and a second electrode of the first control circuit switching transistor is electrically connected to the first reference signal terminal. A gate of the second control circuit switching transistor is electrically connected to the second node, a first electrode of the second control circuit switching transistor is electrically connected to the first node, and a second electrode of the second control circuit switching transistor is electrically connected to the first reference signal terminal. A gate of the third control circuit switching transistor is electrically connected to the second node, a first electrode of the third control circuit switching transistor is electrically connected to the gate signal output terminal, and a second electrode of the third control circuit switching transistor is electrically connected to the second reference signal terminal. A gate and a first electrode of the fourth control circuit switching transistor are electrically connected to the control signal terminal, and a second electrode of the fourth control circuit switching transistor is electrically connected to a first electrode of the sixth control circuit switching transistor and a gate of the fifth control circuit switching transistor. A first electrode of the fifth control circuit switching transistor is electrically connected to the control signal terminal, and a second electrode of the fifth control circuit switching transistor is electrically connected to the second node. A gate of the sixth control circuit switching transistor is electrically connected to the first node, and a second electrode of the sixth control circuit switching transistor is electrically connected to the first reference signal terminal. A gate of the seventh control circuit switching transistor is electrically connected to the first node, a first electrode of the seventh control circuit switching transistor is electrically connected to the second node, and a second electrode of the seventh control circuit switching transistor is electrically connected to the first reference signal terminal. A gate of the eighth control circuit switching transistor is electrically connected to the second node, a first electrode of the eighth control circuit switching transistor is electrically connected to the output control terminal, and a second electrode of the eighth control circuit switching transistor is electrically connected to the first reference signal terminal.

In one possible implementation, in the gate driving circuit provided by the embodiment of the disclosure, two control circuits are provided and electrically connected to two different control signal terminals, respectively, and the two control signal terminals alternately input valid control signals.

In one possible implementation, in the gate driving circuit provided by the embodiment of the disclosure, the first output circuit includes: a first output circuit switching transistor and a capacitor. A gate of the first output circuit switching transistor is electrically connected to the first node, a first electrode of the first output circuit switching transistor is electrically connected to the clock signal terminal, and a second electrode of the first output circuit switching transistor is electrically connected to the gate signal output terminal; and the capacitor is connected between the gate and the second electrode of the first output circuit switching transistor.

In one possible implementation, in the gate driving circuit provided by the embodiment of the disclosure, the second output circuit includes: a switching transistor of the of the second output circuit; and a gate of the switching transistor of the second output circuit is electrically connected to the first node, a first electrode of the switching transistor of the second output circuit is electrically connected to the clock signal terminal, and a second electrode of the switching transistor of the second output circuit is electrically connected to the output control terminal.

In one possible implementation, in the gate driving circuit provided by the embodiment of the disclosure, the frame start circuit includes: a frame start circuit switching transistor; and a gate of the frame start circuit switching transistor is electrically connected to the frame start signal terminal, a first electrode of the frame start circuit switching transistor is electrically connected to the first node, and a second electrode of the frame start circuit switching transistor is electrically connected to the first reference signal terminal.

Correspondingly, an embodiment of the disclosure further provides a display device, including the gate driving circuit provided by the embodiment of the disclosure.

DETAILED DESCRIPTION

The specific implementations of a gate driving circuit and a display device provided by the embodiments of the disclosure will be described in detail below with reference to the accompanying drawings.

Figure 1:
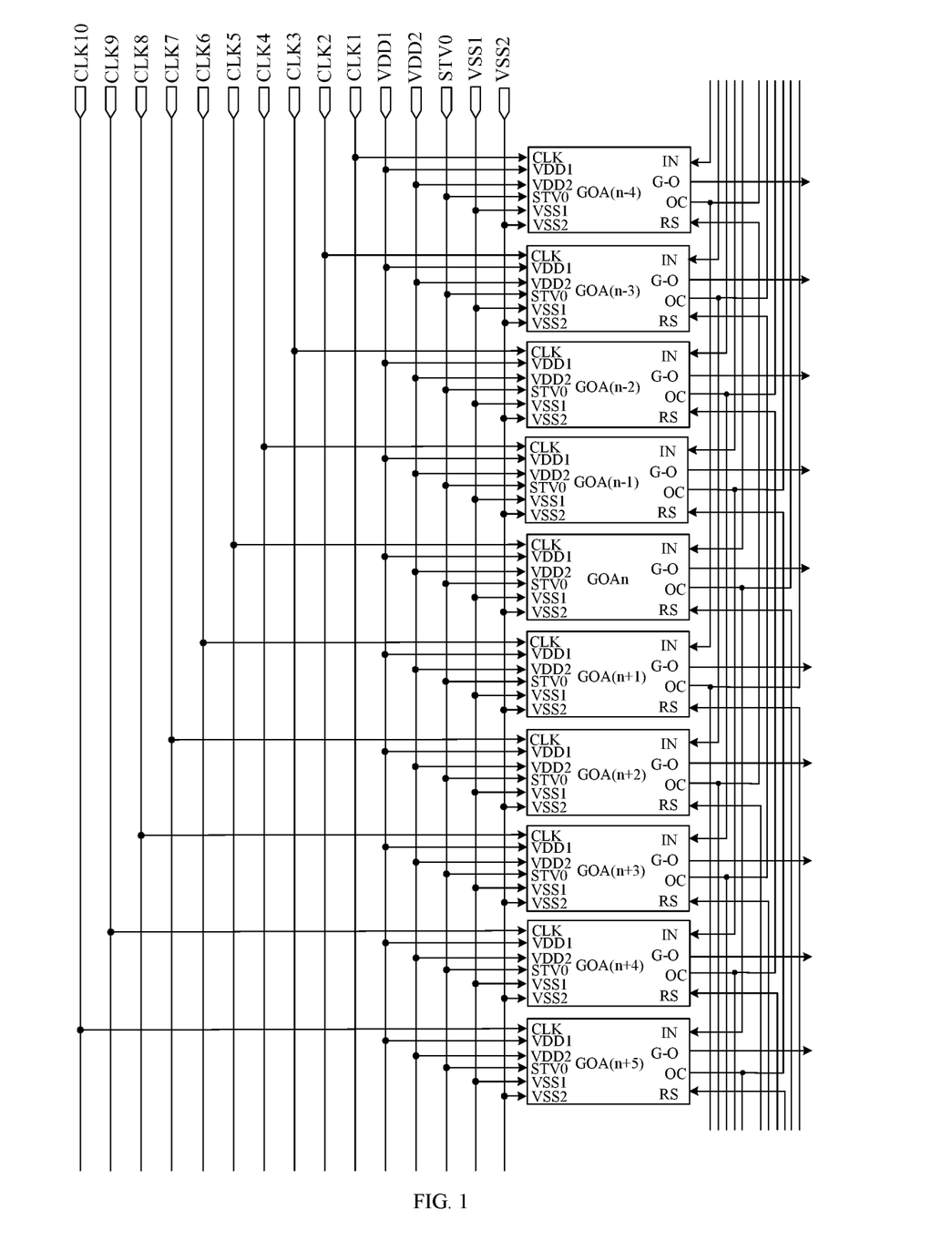
FIG. 1 is a schematic structural diagram of a gate driving circuit provided in the related art.

As shown in FIG. 1, FIG. 1 is a schematic structural diagram of a gate driving circuit provided in the related art, which adopts 10CLK design. The gate driving circuit includes a plurality of cascaded shift registers ( . . . GOA (n−4), GOA(n−3) . . . GOA(n+4), GOA(n+5) . . . ), each shift register includes an input signal terminal IN, a reset signal terminal RS, an output control terminal OC and a gate signal output terminal G-O. The gate signal output terminals G-O are electrically connected to gate lines of a display panel in a one-to-one correspondence. In every six adjacent shift registers, such as six adjacent shift registers from GOAn to GOA(n+5), the output control terminal OC of the first shift register GOAn is electrically connected to the input signal terminal IN of the sixth shift register GOA(n+5). For six adjacent shift registers from GOA(n−1) to GOA(n+4), the output control terminal OC of the first shift register GOA (n−1) is electrically connected to the input signal terminal IN of the sixth shift register GOA(n+4), and so on.

In every seven adjacent shift registers, such as seven adjacent shift registers from GOAn to GOA(n+6), the output control terminal OC of the seventh shift register GOA(n+6) is electrically connected to the reset signal terminal RS of the first shift register GOAn; while for seven adjacent shift registers from GOA(n−1) to GOA(n+5), the output control terminal OC of the seventh shift register GOA(n+5) is electrically connected to the reset signal terminal RS of the first shift register GOA(n−1); and so on.

Figure 2:
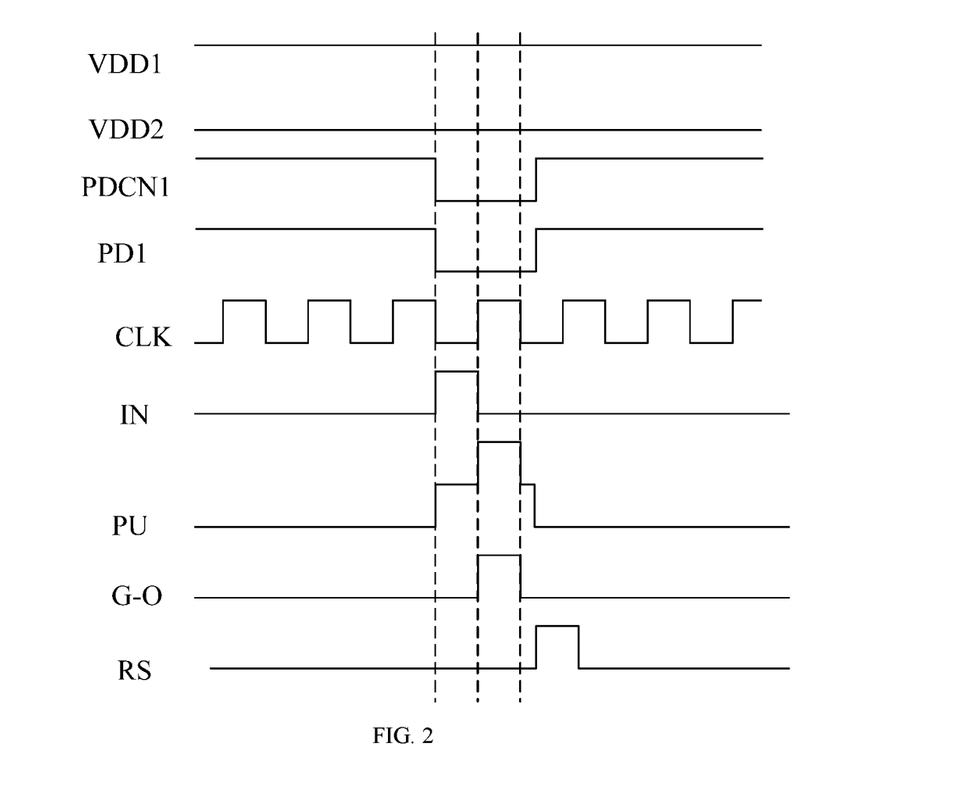
FIG. 2 is a schematic timing chart for the gate driving circuit shown in FIG. 1.

A cascade structure shown in FIG. 1 resets a first node PU in a GOA circuit by delaying the time of 1 row, so as to reverse discharge a gate line to a CLK signal through a switching transistor electrically connected to a CLK. As shown in FIG. 2, FIG. 2 is an input and output timing chart of each shift register in the gate driving circuit shown in FIG. 1. It can be seen that in the cascade structure design of FIG. 1, the time of a high pulse signal and a low pulse signal of the CLK accounts for half respectively, the clock signal duty cycle only is 50%, the flexibility of an external circuit board to input a clock signal to a clock signal line is poor, and there are many cascade signal lines in the cascade structures shown in FIG. 1, which is not conductive to saving space to further realize a narrow bezel.

Figure 3:
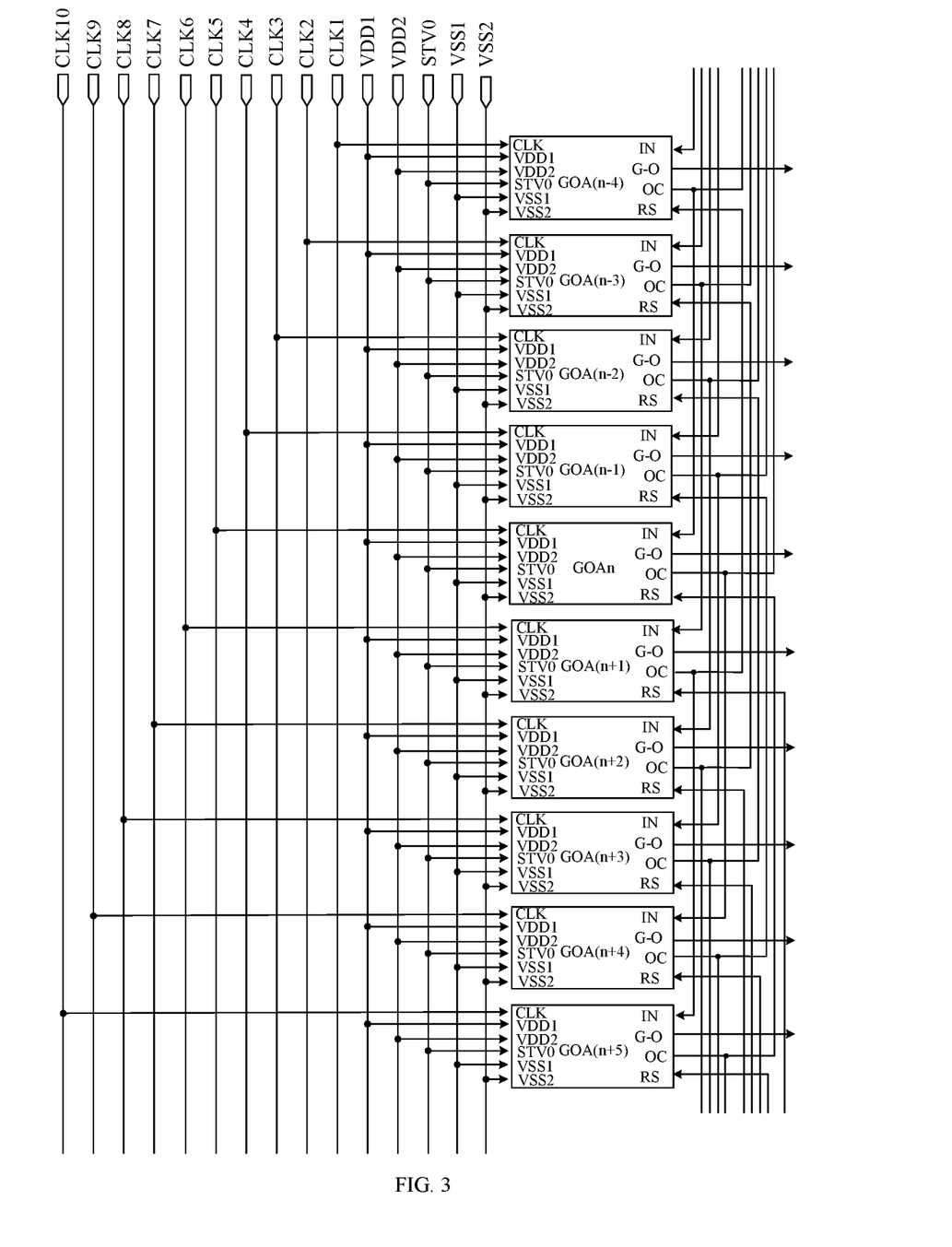
FIG. 3 is a schematic structural diagram of a gate driving circuit provided by an embodiment of the disclosure.

In view of this, the gate driving circuit provided by the embodiment of the disclosure, as shown in FIG. 3, includes a plurality of cascaded shift registers ( . . . GOA(n−4), GOA(n−3) . . . GOA(n+4), GOA(n+5) . . . ), each shift register includes an input signal terminal IN, a reset signal terminal RS, an output control terminal OC and a gate signal output terminal G-O. The respective gate signal output terminals G-O are electrically connected to gate lines of a display panel in a one-to-one corresponding mode.

In every five adjacent shift registers, such as five adjacent shift registers from GOAn to GOA(n+4), the output control terminal OC of the first shift register GOAn is electrically connected to the input signal terminal IN of the fifth shift register GOA(n+4); while for five adjacent shift registers from GOA(n−1) to GOA(n+3), the output control terminal OC of the first shift register GOA(n−1) is electrically connected to the input signal terminal IN of the fifth shift register GOA(n+3), and so on.

In every six adjacent shift registers, such as six adjacent shift registers from GOAn to GOA(n+5), the output control terminal OC of the sixth shift register GOA(n+5) is electrically connected to the reset signal terminal RS of the first shift register GOAn; for six adjacent shift registers from GOA(n−1) to GOA(n+4), the output control terminal OC of the sixth shift register GOA(n+4) is electrically connected to the reset signal terminal RS of the first shift register GOA (n−1); and so on.

In the gate driving circuit provided by the embodiment of the disclosure, in every five adjacent shift registers, the output control terminal of the first shift register is electrically connected to the input signal terminal of the fifth shift register; and in every six adjacent shift registers, the output control terminal of the sixth shift register is electrically connected to the reset signal terminal of the first shift register, so that there are fewer cascade signal lines in the gate driving circuit of the cascade structure, thereby saving space, and further implementing the narrow bezel of a display device. In addition, for the gate driving circuit of the cascade structure provided by the disclosure, the signal provided by the external circuit board can be more flexible, even if a display product is manufactured, a pulse width of a clock signal can be adjusted by means of the external circuit board, thereby adjusting a high-level width of a gate signal output by the gate signal output terminal, and the flexibility is high.

In the specific implementation, the gate driving circuit provided by the embodiment of the disclosure, as illustrated in FIG. 3, includes 10 clock signal lines (CLK1, CLK2, CLK3 . . . CLK10), and each shift register further includes a clock signal terminal CLK.

The clock signal terminal of the (10k−9)th shift register is electrically connected to the first clock signal line, for example, clock signal terminals of first, 11th, 21th . . . shift registers are electrically connected to the first clock signal line CLK1 respectively.

The clock signal terminal of the (10k−8)th shift register is electrically connected to the second clock signal line, for example, clock signal terminals of second, 12th, 22th . . . shift registers are electrically connected to the second clock signal line CLK2.

The clock signal terminal of a (10k−7)th shift register is electrically connected to the third clock signal line, for example, clock signal terminals of third, 13th, 23th . . . shift registers are electrically connected to the third clock signal line CLK3.

The clock signal terminal of a (10k−6)th shift register is electrically connected to the fourth clock signal line, for example, clock signal terminals of fourth, 14th, 24th . . . shift registers are electrically connected to the fourth clock signal line CLK4.

The clock signal terminal of the (10k−5)th shift register is electrically connected to the fifth clock signal line, for example, clock signal terminals of fifth, 15th, 25th . . . shift registers are electrically connected to the fifth clock signal line CLK5.

The clock signal terminal of the (10k−4)th shift register is electrically connected to the sixth clock signal line, for example, clock signal terminals of sixth, 16th, 26th . . . shift registers are electrically connected to the sixth clock signal line CLK6.

The clock signal terminal of the (10k−3)th shift register is electrically connected to the seventh clock signal line, for example, clock signal terminals of seventh, 17th, 27th . . . shift registers are electrically connected to the seventh clock signal line CLK7.

The clock signal terminal of the (10k−2)th shift register is electrically connected to the eighth clock signal line, for example, clock signal terminals of eighth, 18th, 28th . . . shift registers are electrically connected to the eighth clock signal line CLK8.

The clock signal terminal of the (10k−1)th shift register is electrically connected to the ninth clock signal line, for example, clock signal terminals of ninth, 19th, 29th . . . shift registers are electrically connected to the ninth clock signal line CLK9.

The clock signal terminal of the (10k)th shift register is electrically connected to the tenth clock signal line, for example, clock signal terminals of tenth, 20th, 30th . . . shift registers are electrically connected to the tenth clock signal line CLK10.

Here, k is a positive integer.

Figure 4:
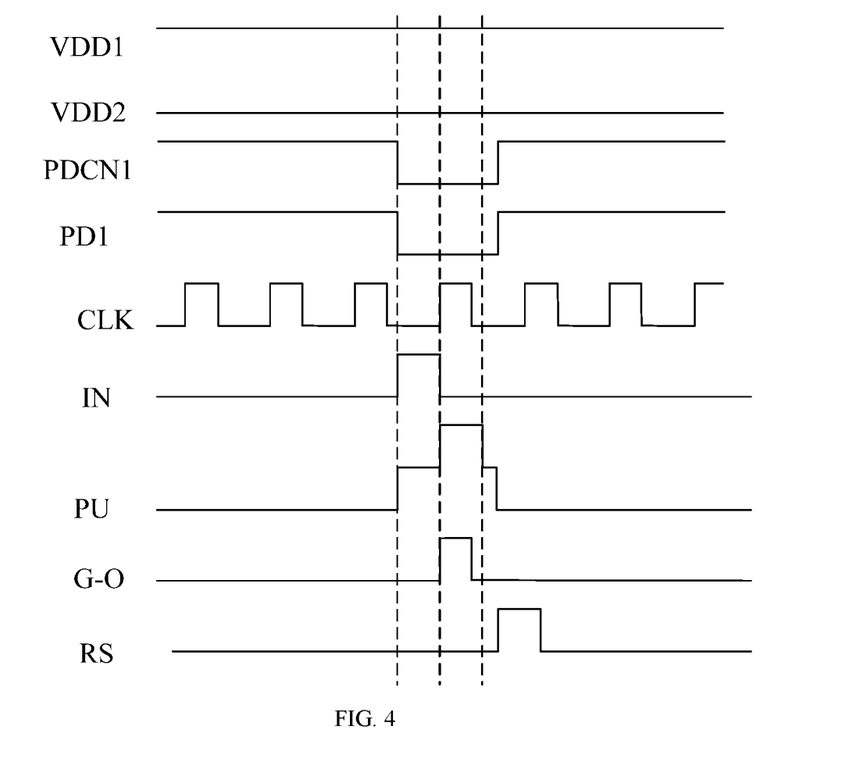
FIG. 4 is a schematic timing chart for the gate driving circuit shown in FIG. 3.

In the specific implementation, in the gate driving circuit provided by the embodiment of the disclosure, as shown in FIG. 4, which is an input and output timing chart of each shift register in the gate driving circuit shown in FIG. 3. Here a clock signal duty cycle of each clock signal line is about 40%. In this way, the cascade structure provided by the embodiment of the disclosure is adopted, so that the clock signal duty cycle of each clock signal line may be about 40%, the signal provided by the external circuit board can be more flexible, even if the display product is manufactured, the pulse width of the clock signal can be adjusted by means of the external circuit board, thereby adjusting the high-level width of the gate signal output by the gate signal output terminal, and the flexibility is high.

It should be noted that the clock signal duty cycle of each clock signal line may also be slightly higher than 40% or slightly lower than 40%, which is designed according to actual needs.

Figure 5:
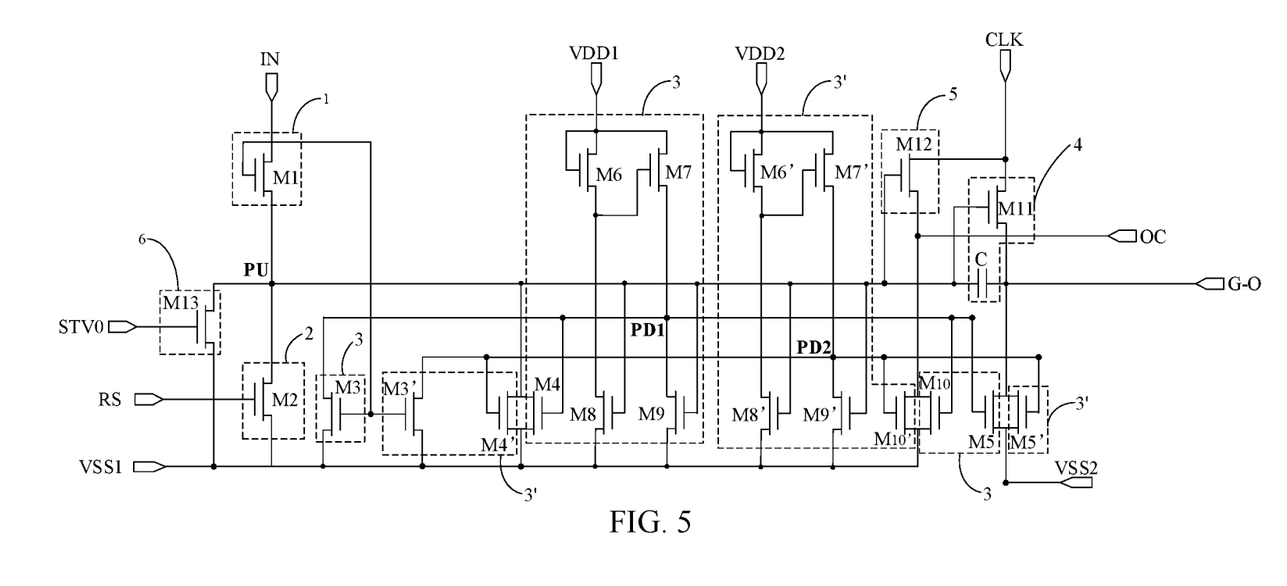
FIG. 5 is a specific schematic structural diagram of a shift register in which all transistors are N-type transistors provided by an embodiment of the disclosure.

In the specific implementation, in the gate driving circuit provided by the embodiment of the disclosure, as shown in FIG. 5, each shift register may include: an input circuit 1, a reset circuit 2, a control circuit, a first output circuit 4, a second output circuit 5 and a frame start circuit 6.

In order to avoid the problem of characteristic offset or even damage of a switching transistor caused by long-time direct-current bias of a switching transistor of one control circuit, there may be two control circuits in the embodiment of the disclosure, which respectively are a first control circuit 3 and a second control circuit 3'. A control signal terminal VDD includes a first control signal terminal VDD1 and a second control signal terminal VDD2 which are electrically connected to the first control circuit 3 and the second control circuit 3', respectively, and the first control signal terminal VDD1 and the second control signal terminal VDD2 alternately input valid control signals.

The input circuit 1 is configured to control a potential of a first node PU in response to a signal input by the input signal terminal IN.

The reset circuit 2 is configured to provide a signal input by a first reference signal terminal VSS1 to the first node PU in response to a signal input by the reset signal terminal RS.

The first control circuit 3 is configured to provide the signal of the first reference signal terminal VSS1 to a second node PD1 in response to the signal input by the input signal terminal IN, control the potentials of the first node PU and the second node PD1 in response to a signal input by the first control signal terminal VDD1, provide a signal of a second reference signal terminal VSS2 to the gate signal output terminal G-O in response to the potential of the second node PD1, and provide the signal of the first reference signal terminal VSS1 to the output control terminal OC in response to the potential of the second node PD1.

The second control circuit 3' is configured to provide the signal of the first reference signal terminal VSS1 to a third node PD2 in response to the signal input by the input signal terminal IN, control the potentials of the first node PU and the third node PD2 in response to a signal input by the second control signal terminal VDD2, provide a signal of a second reference signal terminal VSS2 to the gate signal output terminal G-O in response to the potential of the third node PD2, and provide the signal of the first reference signal terminal VSS1 to the output control terminal OC in response to the potential of the third node PD2.

The first output circuit 4 is configured to provide a signal of the clock signal terminal CLK to the gate signal output terminal G-O in response to the potential of the first node PU.

The second output circuit 5 is configured to provide the signal of the clock signal terminal CLK to the output control terminal OC in response to the potential of the first node PU.

The frame start circuit 6 is configured to provide the signal of the first reference signal terminal VSS1 to the first node PU in response to a potential of a signal input by a frame start signal terminal STV0.

Specifically, after each frame image is output, that is, after the plurality of cascaded shift registers provided by the embodiment of the disclosure output signals, before the next frame image is output, the potentials of all first nodes PU in the plurality of cascaded shift registers are reset through the frame start circuit 6.

In the specific implementation, in the gate driving circuit provided by the embodiment of the disclosure, as shown in FIG. 5, the input circuit 1 may specifically include a first switching transistor M1; where a gate and a first electrode of the first switching transistor M1 are electrically connected to the input signal terminal, and a second electrode is electrically connected to the first node.

The above is only an example to illustrate the specific structure of the input circuit in the shift register. In the specific implementation, the specific structure of the input circuit is not limited to the above structure provided by the embodiment of the disclosure, and may also be other structures known to those skilled in the art, which is not limited here.

In the specific implementation, in the gate driving circuit provided by the embodiment of the disclosure, as shown in FIG. 5, the reset circuit 2 may include: a rest circuit switching transistor M2; and a gate of the rest circuit switching transistor M2 is electrically connected to the reset signal terminal RS, a first electrode of the rest circuit switching transistor is electrically connected to the first node PU, and a second electrode of the rest circuit switching transistor is electrically connected to the first reference signal terminal VSS1.

The above is only an example to illustrate the specific structure of the reset circuit in the shift register. In the specific implementation, the specific structure of the reset circuit is not limited to the above structure provided by the embodiment of the disclosure, and may also be other structures known to those skilled in the art, which is not limited here.

In the specific implementation, in the gate driving circuit provided by the embodiment of the disclosure, as shown in FIG. 5, the first control circuit 3 may include: a first switching transistor of the first control circuit M3, a second switching transistor of the first control circuit M4, a third switching transistor of the first control circuit M5, a fourth switching transistor of the first control circuit M6, a fifth switching transistor of the first control circuit M7, a sixth switching transistor of the first control circuit M8, a seventh switching transistor of the first control circuit M9 and an eighth switching transistor of the first control circuit M10.

A gate of the first switching transistor of the first control circuit M3 is electrically connected to the input signal terminal IN, a first electrode of the first switching transistor of the first control circuit M3 is electrically connected to the second node PD1, and a second electrode of first switching transistor of the first control circuit M3 is electrically connected to the first reference signal terminal VSS1.

A gate of the second switching transistor of the first control circuit M4 is electrically connected to the second node PD1, a first electrode of the second switching transistor of the first control circuit M4 is electrically connected to the first node PU, and a second electrode of the second switching transistor of the first control circuit M4 is electrically connected to the first reference signal terminal VSS1.

A gate of the third switching transistor of the first control circuit M5 is electrically connected to the second node PD1, a first electrode of the third switching transistor of the first control circuit M5 is electrically connected to the gate signal output terminal G-O of the gate driving circuit, and a second electrode of the third switching transistor of the first control circuit M5 is electrically connected to the second reference signal terminal VSS2.

A gate and a first electrode of the fourth switching transistor of the first control circuit M6 are electrically connected to the first control signal terminal VDD1, and a second electrode of the fourth switching transistor of the first control circuit M6 is electrically connected to a first electrode of the sixth switching transistor of the first control circuit M8 and a gate of the fifth switching transistor of the first control circuit M7 respectively.

A first electrode of the fifth switching transistor of the first control circuit M7 is electrically connected to the first control signal terminal VDD1, and a second electrode of the fifth switching transistor of the first control circuit M7 is electrically connected to the second node PD1.

A gate of the sixth switching transistor of the first control circuit M8 is electrically connected to the first node PU, and a second electrode of the sixth switching transistor of the first control circuit M8 is electrically connected to the first reference signal terminal VSS1.

A gate of the seventh switching transistor of the first control circuit M9 is electrically connected to the first node PU, a first electrode of the seventh switching transistor of the first control circuit M9 is electrically connected to the second node PD1, and a second electrode of the seventh switching transistor of the first control circuit M9 is electrically connected to the first reference signal terminal VSS1.

A gate of the eighth switching transistor of the first control circuit M10 is electrically connected to the second node PD1, a first electrode of the eighth switching transistor of the first control circuit M10 is electrically connected to the output control terminal OC of the gate driving circuit, and a second electrode of the eighth switching transistor of the first control circuit M10 is electrically connected to the first reference signal terminal VSS1.

The second control circuit 3' may include: a first switching transistor of the second control circuit M3', a second switching transistor of the second control circuit M4', a third switching transistor of the second control circuit M5', a fourth switching transistor of the second control circuit M6', a fifth switching transistor of the second control circuit M7', a sixth switching transistor of the second control circuit M8', a seventh switching transistor of the second control circuit M9' and an eighth switching transistor of the second control circuit M10'.

A gate of the first switching transistor of the second control circuit M3' is electrically connected to the input signal terminal IN, a first electrode of the first switching transistor of the second control circuit M3' is electrically connected to the second node PD1, and a second electrode of the first switching transistor of the second control circuit M3' is electrically connected to the first reference signal terminal VSS1.

A gate of the second switching transistor of the second control circuit M4' is electrically connected to the third node PD2, a first electrode of the second switching transistor of the second control circuit M4' is electrically connected to the first node PU, and a second electrode of the second switching transistor of the second control circuit M4' is electrically connected to the first reference signal terminal VSS1.

A gate of the third switching transistor of the second control circuit M5' is electrically connected to the third node PD2, a first electrode of the third switching transistor of the second control circuit M5' is electrically connected to the gate signal output terminal G-O of the gate driving circuit, and a second electrode of the third switching transistor of the second control circuit M5' is electrically connected to the second reference signal terminal VSS2.

A gate and a first electrode of the fourth switching transistor of the second control circuit M6' are electrically connected to the second control signal terminal VDD2, and a second electrode of the fourth switching transistor of the second control circuit M6' is electrically connected to a first electrode of the sixth switching transistor of the second control circuit M8' and a gate of the fifth switching transistor of the second control circuit M7' respectively.

A first electrode of the fifth switching transistor of the second control circuit M7' is electrically connected to the second control signal terminal VDD2, and a second electrode of the fifth switching transistor of the second control circuit M7' is electrically connected to the third node PD2.

A gate of the sixth switching transistor of the second control circuit M8' is electrically connected to the first node PU, and a second electrode of the sixth switching transistor of the second control circuit M8' is electrically connected to the first reference signal terminal VSS1.

A gate of the seventh switching transistor of the second control circuit M9' is electrically connected to the first node PU, a first electrode of the seventh switching transistor of the second control circuit M9' is electrically connected to the third node PD2, and a second electrode of the seventh switching transistor of the second control circuit M9' is electrically connected to the first reference signal terminal VSS1.

A gate of the eighth switching transistor of the second control circuit M10' is electrically connected to the third node PD2, a first electrode of the eighth switching transistor of the second control circuit M10' is electrically connected to the output control terminal OC of the gate driving circuit, and a second electrode of the eighth switching transistor of the second control circuit M10' is electrically connected to the first reference signal terminal VSS1.

The above is only an example to illustrate the specific structures of the first control circuit and the second control circuit in the shift register. In the specific implementation, the specific structures of the first control circuit and the second control circuit are not limited to the above structures provided by the embodiment of the disclosure, and may also be other structures known to those skilled in the art, which is not limited here.

In the specific implementation, in the gate driving circuit provided by the embodiment of the disclosure, as shown in FIG. 5, the first output circuit 4 may specifically include a first output circuit switching transistor M11 and a capacitor C.

A gate of the first output circuit switching transistor M11 is electrically connected to the first node PU, a first electrode of the first output circuit switching transistor M11 is electrically connected to the clock signal terminal CLK, and a second electrode of the first output circuit switching transistor M11 is electrically connected to the gate signal output terminal G-O of the gate driving circuit.

The capacitor C is connected between the gate and the second electrode of the first output circuit switching transistor M11.

The above is only an example to illustrate the specific structure of the first output circuit in the shift register. In the specific implementation, the specific structure of the first output circuit is not limited to the above structure provided by the embodiment of the disclosure, and may also be other structures known to those skilled in the art, which is not limited here.

In the specific implementation, in the gate driving circuit provided by the embodiment of the disclosure, as shown in FIG. 5, the second output circuit 5 may specifically include: a switching transistor of the second output circuit M12; and a gate of the switching transistor of the second output circuit M12 is electrically connected to the first node PU, a first electrode of the switching transistor of the second output circuit M12 is electrically connected to the clock signal terminal CLK, and a second electrode of the switching transistor of the second output circuit M12 is electrically connected to the output control terminal OC of the gate driving circuit.

The above is only an example to illustrate the specific structure of the second output circuit in the shift register. In the specific implementation, the specific structure of the second output circuit is not limited to the above structure provided by the embodiment of the disclosure, and may also be other structures known to those skilled in the art, which is not limited here.

In the specific implementation, in the gate driving circuit provided by the embodiment of the disclosure, as shown in FIG. 5, the frame start circuit 6 may specifically include: a frame start circuit switching transistor M13; and a gate of the frame start circuit switching transistor M13 is electrically connected to the frame start signal terminal STV0, a first electrode of the frame start circuit switching transistor M13 is electrically connected to the first node PU, and a second electrode of the frame start circuit switching transistor M13 is electrically connected to the first reference signal terminal VSS1.

The above is only an example to illustrate the specific structure of the frame start circuit in the shift register. In the specific implementation, the specific structure of the frame start circuit is not limited to the above structure provided by the embodiment of the disclosure, and may also be other structures known to those skilled in the art, which is not limited here.

It should be noted that in a normal shift register, a signal output by the gate signal output terminal G-O of this stage is used as a signal of the input signal terminal IN of the gate driving circuit of next stage, however, in the specific working process, the signal output by the gate signal output terminal G-O may fluctuate due to the influence of a gate line, resulting in unstable output. Therefore, a signal output by the second output circuit in the Nth shift register of the disclosure is output from the output control terminal OC to be used as a signal of the input signal terminal IN of a (N+4)th shift register, which can improve the stability of signal output and ensure the normal output of the gate driving circuit.

It should be noted that the embodiment of the disclosure mainly solves the problem that in an existing 75-inch/8K/120 Hz display product, there are many cascade signal lines for cascading the shift registers, and the flexibility of the external circuit board to provide clock signals to the existing gate driving circuit is poor, the input and output working principle of the gate driving circuit in a normal working state is the same as the working principle of the gate driving circuit in the related art, which will be not described in detail here.

In the specific implementation, in the gate driving circuit provided by the embodiment of the disclosure, as shown in FIG. 5, all switching transistors may be N-type transistors. Potentials of the first reference signal terminal VSS1 and the second reference signal terminal VSS2 are both low potentials, the first control signal terminal VDD1 and the second control signal terminal VDD2 alternately output high and low potentials, that is, when the first control signal terminal VDD1 is at a high potential, the second control signal terminal VDD2 is at a low potential, and when the first control signal terminal VDD1 is at the low potential, the second control signal terminal VDD2 is at the high potential.

Of course, in the specific implementation, in the gate driving circuit provided by the embodiment of the disclosure, all switching transistors may also be P-type transistors.

Moreover, in the specific implementation, the N-type transistors are turned on in response to the high potential, and are turned off in response to the low potential; and the P-type transistors are turned off in response to the high potential, and are turned on in response to the low potential.

It should be noted that the switching transistors mentioned in the above embodiments of the disclosure may be thin film transistors (TFTs), and may also be metal oxide semiconductors (MOSs), which is not limited here. In the specific implementation, the functions of the first electrodes and the second electrodes of these switching transistors may be interchanged according to the type of the transistor and the input signals, which is not specifically distinguished. Specifically, the first electrodes of the switching transistors mentioned in the above embodiments of the disclosure may be sources, and the second electrodes may be drains; or the first electrodes may be drains, and the second electrodes may be sources, which is not specifically distinguished.

Based on the same inventive concept, an embodiment of the disclosure further provides a display device, including the above gate driving circuit. The display device may be any display panels of products with display functions such as a mobile phone, a tablet computer, a television, a monitor, a notebook computer, a digital photo frame, a navigator, etc. The implementation of the display device may refer to the implementation of the above gate driving circuit, and the repetition will not be made.

The embodiments of the disclosure provide the gate driving circuit and the display device. According to the gate driving circuit, in every five adjacent shift registers, the output control terminal of the first shift register is electrically connected to the input signal terminal of the fifth shift register; and in every six adjacent shift registers, the output control terminal of the sixth shift register is electrically connected to the reset signal terminal of the first shift register. In the gate driving circuit of the cascade structure provided by the disclosure, there are fewer cascade signal lines, thereby saving space, further implementing the narrow bezel of the display device; in addition, for the gate driving circuit of the cascade structure provided by the disclosure, the signal provided by the external circuit board can be more flexible, even if a display product is manufactured, the pulse width of the clock signal can be adjusted by means of the external circuit board, thereby adjusting the high-level width of the gate signal output by the gate signal output terminal, and the flexibility is high.

Obviously, those skilled in the art can make various changes and modifications to the disclosure without departing from the spirit and scope of the disclosure. As such, provided that these modifications and variations of the disclosure fall within the scope of the claims of the disclosure and their equivalents, the disclosure is also intended to cover such modifications and variations.

What is claimed is:

1. A gate driving circuit, comprising a plurality of cascaded shift registers, wherein
    each shift register comprises an input signal terminal, a reset signal terminal, an output control terminal and a gate signal output terminal;
    gate signal output terminals are electrically connected to gate lines of a display panel in a one-to-one corresponding mode;
    in every five adjacent shift registers, an output control terminal of a first shift register among the every five adjacent shift registers is electrically connected to an input signal terminal of a fifth shift register among the every five adjacent shift registers; and
    in every six adjacent shift registers, an output control terminal of a sixth shift register among the every six adjacent shift registers is electrically connected to the reset signal terminal of the first shift register among the every six adjacent shift registers.

2. The gate driving circuit according to claim 1, comprising 10 clock signal lines, wherein each shift register further comprises a clock signal terminal;
   a clock signal terminal of a (10k−9)th shift register is electrically connected to a first clock signal line;
   a clock signal terminal of a (10k−8)th shift register is electrically connected to a second clock signal line;
   a clock signal terminal of a (10k−7)th shift register is electrically connected to a third clock signal line;
   a clock signal terminal of a (10k−6)th shift register is electrically connected to a fourth clock signal line;
   a clock signal terminal of a (10k−5)th shift register is electrically connected to a fifth clock signal line;
   a clock signal terminal of a (10k−4)th shift register is electrically connected to a sixth clock signal line;
   a clock signal terminal of a (10k−3)th shift register is electrically connected to a seventh clock signal line;
   a clock signal terminal of a (10k−2)th shift register is electrically connected to an eighth clock signal line;
   a clock signal terminal of a (10k−1)th shift register is electrically connected to a ninth clock signal line;
   a clock signal terminal of a (10k)th shift register is electrically connected to a tenth clock signal line; and
   k is a positive integer.

3. The gate driving circuit according to claim 2, wherein a clock signal duty cycle of each clock signal line is approximately 40%.

4. The gate driving circuit according to claim 1, wherein each shift register comprises: an input circuit, a reset circuit, a control circuit, a first output circuit, a second output circuit and a frame start circuit; wherein
   the input circuit is configured to control a potential of a first node in response to a signal input by the input signal terminal;
   the reset circuit is configured to provide a signal input by a first reference signal terminal to the first node in response to a signal input by the reset signal terminal;
   the control circuit is configured to provide the signal of the first reference signal terminal to a second node in response to the signal input by the input signal terminal, control the potentials of the first node and the second node in response to a signal input by a control signal terminal, provide a signal of a second reference signal terminal to the gate signal output terminal in response to a potential of the second node, and provide the signal of the first reference signal terminal to the output control terminal in response to the potential of the second node;
   the first output circuit is configured to provide a signal of the clock signal terminal to the gate signal output terminal in response to the potential of the first node;
   the second output circuit is configured to provide the signal of the clock signal terminal to the output control terminal in response to the potential of the first node; and
   the frame start circuit is configured to provide the signal of the first reference signal terminal to the first node in response to a signal input by a frame start signal terminal.

5. The gate driving circuit according to claim 4, wherein the input circuit comprises: a first switching transistor; and
   a gate and a first electrode of the first switching transistor are electrically connected to the input signal terminal, and a second electrode of the first switching transistor is electrically connected to the first node.

6. The gate driving circuit according to claim 4, wherein the reset circuit comprises: a reset circuit switching transistor; and
   a gate of the reset circuit switching transistor is electrically connected to the reset signal terminal, a first electrode of the reset circuit switching transistor is electrically connected to the first node, and a second electrode of the reset circuit switching transistor is electrically connected to the first reference signal terminal.

7. The gate driving circuit according to claim 4, wherein the control circuit comprises: a first control circuit switching transistor, a second control circuit switching transistor, a third control circuit switching transistor, a fourth control circuit switching transistor, a fifth control circuit switching transistor, a sixth control circuit switching transistor, a seventh control circuit switching transistor and an eighth control circuit switching transistor;
   a gate of the first control circuit switching transistor is electrically connected to the input signal terminal, a first electrode of the first control circuit switching transistor is electrically connected to the second node, and a second electrode of the first control circuit switching transistor is electrically connected to the first reference signal terminal;
   a gate of the second control circuit switching transistor is electrically connected to the second node, a first electrode of the second control circuit switching transistor is electrically connected to the first node, and a second electrode of the second control circuit switching transistor is electrically connected to the first reference signal terminal;
   a gate of the third control circuit switching transistor is electrically connected to the second node, a first electrode of the third control circuit fifth switching transistor is electrically connected to the gate signal output terminal, and a second electrode of the third control circuit switching transistor is electrically connected to the second reference signal terminal;
   a gate and a first electrode of the fourth control circuit switching transistor are electrically connected to the control signal terminal, and a second electrode of the fourth control circuit switching transistor is electrically connected to a first electrode of the sixth control circuit switching transistor and a gate of the fifth control circuit switching transistor;
   a first electrode of the fifth control circuit switching transistor is electrically connected to the control signal terminal, and a second electrode of the fifth control circuit switching transistor is electrically connected to the second node;
   a gate of the sixth control circuit eighth switching transistor is electrically connected to the first node, and a second electrode of the sixth control circuit switching transistor is electrically connected to the first reference signal terminal;
   a gate of the seventh control circuit switching transistor is electrically connected to the first node, a first electrode of the seventh control circuit switching transistor is electrically connected to the second node, and a second electrode of the seventh control circuit switching transistor is electrically connected to the first reference signal terminal; and
   a gate of the eighth control circuit switching transistor is electrically connected to the second node, a first electrode of the eighth control circuit switching transistor is electrically connected to the output control terminal, and a second electrode of the eighth control circuit switching transistor is electrically connected to the first reference signal terminal.

8. The gate driving circuit according to claim 7, wherein two said control circuits are provided and electrically connected to two different control signal terminals, respectively, and the two control signal terminals alternately input valid control signals.

9. The gate driving circuit according to claim 7, wherein the second output circuit comprises: a switching transistor of the second output circuit; and a gate of the switching transistor of the second output circuit is electrically connected to the first node, a first electrode of the switching transistor of the second output circuit is electrically connected to the clock signal terminal, and a second electrode of the switching transistor of the second output circuit is electrically connected to the output control terminal.

10. The gate driving circuit according to claim 4, wherein the first output circuit comprises: a first output circuit switching transistor and a capacitor;

a gate of the first output circuit switching transistor is electrically connected to the first node, a first electrode of the first output circuit switching transistor is electrically connected to the clock signal terminal, and a second electrode of the first output circuit switching transistor is electrically connected to the gate signal output terminal; and the capacitor is connected between the gate and the second electrode of the first output circuit switching transistor.

11. The gate driving circuit according to claim 4, wherein the frame start circuit comprises: a frame start circuit switching transistor; and a gate of the frame start circuit switching transistor is electrically connected to the frame start signal terminal, a first electrode of the frame start circuit switching transistor is electrically connected to the first node, and a second electrode of the frame start circuit switching transistor is electrically connected to the first reference signal terminal.

12. The gate driving circuit according to claim 1, wherein each shift register comprises: an input circuit, a reset circuit, a first control circuit, a second control circuit, a first output circuit, a second output circuit and a frame start circuit; wherein the input circuit is configured to control a potential of a first node in response to a signal input by the input signal terminal;

the reset circuit is configured to provide a signal input by a first reference signal terminal to the first node in response to a signal input by the reset signal terminal;

the first control circuit is configured to provide the signal of the first reference signal terminal to a second node in response to the signal input by the input signal terminal, control the potentials of the first node and the second node in response to a signal input by a first control signal terminal, provide a signal of a second reference signal terminal to the gate signal output terminal in response to a potential of the second node, and provide the signal of the first reference signal terminal to the output control terminal in response to the potential of the second node;

the second control circuit is configured to provide the signal of the first reference signal terminal to a third node in response to the signal input by the input signal terminal, control the potentials of the first node and the third node in response to a signal input by a second control signal terminal, provide a signal of a second reference signal terminal to the gate signal output terminal in response to a potential of the third node, and provide the signal of the first reference signal terminal to the output control terminal in response to the potential of the third node;

the first output circuit is configured to provide a signal of the clock signal terminal to the gate signal output terminal in response to the potential of the first node;

the second output circuit is configured to provide the signal of the clock signal terminal to the output control terminal in response to the potential of the first node; and the frame start circuit is configured to provide the signal of the first reference signal terminal to the first node in response to a signal input by a frame start signal terminal.

13. The gate driving circuit according to claim 12, wherein the first control circuit comprises: a first switching transistor of the first control circuit, a second switching transistor of the first control circuit, a third switching transistor of the first control circuit, a fourth switching transistor of the first control circuit, a fifth switching transistor of the first control circuit, a sixth switching transistor of the first control circuit, a seventh switching transistor of the first control circuit and an eighth switching transistor of the first control circuit;

a gate of the first switching transistor of the first control circuit is electrically connected to the input signal terminal, a first electrode of the first switching transistor of the first control circuit is electrically connected to the second node, and a second electrode of the first switching transistor of the first control circuit is electrically connected to the first reference signal terminal;

a gate of the second switching transistor of the first control circuit is electrically connected to the second node, a first electrode of the second switching transistor of the first control circuit is electrically connected to the first node, and a second electrode of the second switching transistor of the first control circuit is electrically connected to the first reference signal terminal;

a gate of the third switching transistor of the first control circuit is electrically connected to the second node, a first electrode of the third switching transistor of the first control circuit is electrically connected to the gate signal output terminal, and a second electrode of the third switching transistor of the first control circuit is electrically connected to the second reference signal terminal;

a gate and a first electrode of the fourth switching transistor of the first control circuit are electrically connected to the first control signal terminal, and a second electrode of the fourth switching transistor of the first control circuit is electrically connected to a first electrode of the sixth switching transistor of the first control circuit and a gate of the fifth switching transistor of the first control circuit;

a first electrode of the fifth switching transistor of the first control circuit is electrically connected to the first control signal terminal, and a second electrode of the fifth switching transistor of the first control circuit is electrically connected to the second node;

a gate of the sixth switching transistor of the first control circuit is electrically connected to the first node, and a second electrode of the sixth switching transistor of the first control circuit is electrically connected to the first reference signal terminal;

a gate of the seventh switching transistor of the first control circuit is electrically connected to the first node, a first electrode of the seventh switching transistor of the first control circuit is electrically connected to the second node, and a second electrode of the seventh switching transistor of the first control circuit is electrically connected to the first reference signal terminal; and a gate of the eighth switching transistor of the first control circuit is electrically connected to the second node, a first electrode of the eighth switching transistor of the first control circuit is electrically connected to the output control terminal, and a second electrode of the eighth switching transistor of the first control circuit is electrically connected to the first reference signal terminal;

the second control circuit comprises: a first switching transistor of the second control circuit, a second switching transistor of the second control circuit, a third switching transistor of the second control circuit, a fourth switching transistor of the second control circuit, a fifth switching transistor of the second control circuit, a sixth switching transistor of the second control circuit, a seventh switching transistor of the second control circuit and an eighth switching transistor of the second control circuit; wherein a gate of the first switching transistor of the second control circuit is electrically connected to the input signal terminal, a first electrode of the first switching transistor of the second control circuit is electrically connected to the second node, and a second electrode of the first switching transistor of the second control circuit is electrically connected to the first reference signal terminal;

a gate of the second switching transistor of the second control circuit is electrically connected to the third node, a first electrode of the second switching transistor of the second control circuit is electrically connected to the first node, and a second electrode of the second switching transistor of the second control circuit is electrically connected to the first reference signal terminal;

a gate of the third switching transistor of the second control circuit is electrically connected to the third node, a first electrode of the third switching transistor of the second control circuit is electrically connected to the gate signal output terminal of the gate driving circuit, and a second electrode of the third switching transistor of the second control circuit is electrically connected to the second reference signal terminal;

a gate and a first electrode of the fourth switching transistor of the second control circuit are electrically connected to the second control signal terminal, and a second electrode of the fourth switching transistor of the second control circuit is electrically connected to a first electrode of the sixth switching transistor of the second control circuit and a gate of the fifth switching transistor of the second control circuit;

a first electrode of the fifth switching transistor of the second control circuit is electrically connected to the second control signal terminal, and a second electrode of the fifth switching transistor of the second control circuit is electrically connected to the third node;

a gate of the sixth switching transistor of the second control circuit is electrically connected to the first node, and a second electrode of the sixth switching transistor of the second control circuit is electrically connected to the first reference signal terminal;

a gate of the seventh switching transistor of the second control circuit is electrically connected to the first node, a first electrode of the seventh switching transistor of the second control circuit is electrically connected to the third node, and a second electrode of the seventh switching transistor of the second control circuit is electrically connected to the first reference signal terminal; and a gate of the eighth switching transistor of the second control circuit is electrically connected to the third node, a first electrode of the eighth switching transistor of the second control circuit is electrically connected to the output control terminal of the gate driving circuit, and a second electrode of the eighth switching transistor of the second control circuit is electrically connected to the first reference signal terminal.

14. A display device, comprising a gate driving circuit, wherein the gate driving circuit comprises:
   each shift register comprises an input signal terminal, a reset signal terminal, an output control terminal and a gate signal output terminal;
   gate signal output terminals are electrically connected to gate lines of a display panel in a one-to-one corresponding mode;
   in every five adjacent shift registers, an output control terminal of a first shift register among the every five adjacent shift registers is electrically connected to an input signal terminal of a fifth shift register among the every five adjacent shift registers; and
   in every six adjacent shift registers, an output control terminal of a sixth shift register among the every six adjacent shift registers is electrically connected to the reset signal terminal of the first shift register among the every six adjacent shift registers.

15. The display device according to claim 14, wherein the gate driving circuit comprises 10 clock signal lines, wherein each shift register further comprises a clock signal terminal;
   a clock signal terminal of a (10k−9)th shift register is electrically connected to a first clock signal line;
   a clock signal terminal of a (10k−8)th shift register is electrically connected to a second clock signal line;
   a clock signal terminal of a (10k−7)th shift register is electrically connected to a third clock signal line;
   a clock signal terminal of a (10k−6)th shift register is electrically connected to a fourth clock signal line;
   a clock signal terminal of a (10k−5)th shift register is electrically connected to a fifth clock signal line;
   a clock signal terminal of a (10k−4)th shift register is electrically connected to a sixth clock signal line;
   a clock signal terminal of a (10k−3)th shift register is electrically connected to a seventh clock signal line;
   a clock signal terminal of a (10k−2)th shift register is electrically connected to an eighth clock signal line;
   a clock signal terminal of a (10k−1)th shift register is electrically connected to a ninth clock signal line;
   a clock signal terminal of a (10k)th shift register is electrically connected to a tenth clock signal line; and
   k is a positive integer.

16. The display device according to claim 14, wherein each shift register comprises: an input circuit, a reset circuit, a control circuit, a first output circuit, a second output circuit and a frame start circuit; wherein the input circuit is configured to control a potential of a first node in response to a signal input by the input signal terminal;

the reset circuit is configured to provide a signal input by a first reference signal terminal to the first node in response to a signal input by the reset signal terminal;

the control circuit is configured to provide the signal of the first reference signal terminal to a second node in response to the signal input by the input signal terminal, control the potentials of the first node and the second node in response to a signal input by a control signal terminal, provide a signal of a second reference signal terminal to the gate signal output terminal in response to a potential of the second node, and provide the signal of the first reference signal terminal to the output control terminal in response to the potential of the second node;

the first output circuit is configured to provide a signal of the clock signal terminal to the gate signal output terminal in response to the potential of the first node;

the second output circuit is configured to provide the signal of the clock signal terminal to the output control terminal in response to the potential of the first node; and the frame start circuit is configured to provide the signal of the first reference signal terminal to the first node in response to a signal input by a frame start signal terminal.

17. The display device according to claim 16, wherein the input circuit comprises: a first switching transistor; and a gate and a first electrode of the first switching transistor are electrically connected to the input signal terminal, and a second electrode of the first switching transistor is electrically connected to the first node.

18. The display device according to claim 16, wherein the reset circuit comprises: a reset circuit switching transistor; and a gate of the reset circuit switching transistor is electrically connected to the reset signal terminal, a first electrode of the reset circuit switching transistor is electrically connected to the first node, and a second electrode of the reset circuit switching transistor is electrically connected to the first reference signal terminal.

19. The display device according to claim 16, wherein the control circuit comprises: a first control circuit switching transistor, a second control circuit switching transistor, a third control circuit switching transistor, a fourth control circuit switching transistor, a fifth control circuit switching transistor, a sixth control circuit switching transistor, a seventh control circuit switching transistor and an eighth control circuit switching transistor;

a gate of the first control circuit switching transistor is electrically connected to the input signal terminal, a first electrode of the first control circuit switching transistor is electrically connected to the second node, and a second electrode of the first control circuit switching transistor is electrically connected to the first reference signal terminal;

a gate of the second control circuit switching transistor is electrically connected to the second node, a first electrode of the second control circuit switching transistor is electrically connected to the first node, and a second electrode of the second control circuit switching transistor is electrically connected to the first reference signal terminal;

a gate of the third control circuit switching transistor is electrically connected to the second node, a first electrode of the third control circuit switching transistor is electrically connected to the gate signal output terminal, and a second electrode of the third control circuit switching transistor is electrically connected to the second reference signal terminal;

a gate and a first electrode of the fourth control circuit switching transistor are electrically connected to the control signal terminal, and a second electrode of the fourth control circuit switching transistor is electrically connected to a first electrode of the sixth control circuit switching transistor and a gate of the fifth control circuit switching transistor;

a first electrode of the fifth control circuit switching transistor is electrically connected to the control signal terminal, and a second electrode of the fifth control circuit switching transistor is electrically connected to the second node;

a gate of the sixth control circuit switching transistor is electrically connected to the first node, and a second electrode of the sixth control circuit switching transistor is electrically connected to the first reference signal terminal;

a gate of the seventh control circuit switching transistor is electrically connected to the first node, a first electrode of the seventh control circuit switching transistor is electrically connected to the second node, and a second electrode of the seventh control circuit switching transistor is electrically connected to the first reference signal terminal; and a gate of the eighth control circuit switching transistor is electrically connected to the second node, a first electrode of the eighth control circuit switching transistor is electrically connected to the output control terminal, and a second electrode of the eighth control circuit switching transistor is electrically connected to the first reference signal terminal.

20. The display device according to claim 16, wherein the first output circuit comprises: a first output circuit switching transistor and a capacitor;

a gate of the first output circuit switching transistor is electrically connected to the first node, a first electrode of the first output circuit switching transistor is electrically connected to the clock signal terminal, and a second electrode of the first output circuit switching transistor is electrically connected to the gate signal output terminal; and the capacitor is connected between the gate and the second electrode of the first output circuit switching transistor.

* * * * *